(12) United States Patent
Stranford et al.

(10) Patent No.: US 7,569,977 B2
(45) Date of Patent: Aug. 4, 2009

(54) LASER CAPACITANCE TRIMMED PIEZOELECTRIC ELEMENT AND METHOD OF MAKING THE SAME

(75) Inventors: Gerald Stranford, Albuquerque, NM (US); Thomas A. Knecht, Dundee, IL (US)

(73) Assignee: CTS Corporation, Elkhart, IN (US)

( * ) Notice: Subject to any disclaimer, the term of this patent is extended or adjusted under 35 U.S.C. 154(b) by 0 days.

(21) Appl. No.: 11/888,033

(22) Filed: Jul. 31, 2007

(65) Prior Publication Data
US 2008/0030106 A1 Feb. 7, 2008

Related U.S. Application Data

(60) Provisional application No. 60/834,879, filed on Aug. 2, 2006.

(51) Int. Cl.
*H01L 41/047* (2006.01)
(52) U.S. Cl. .................. 310/366; 310/312; 310/337; 310/365
(58) Field of Classification Search .......... 310/312, 310/337, 363, 365, 366; 29/25.35
See application file for complete search history.

(56) References Cited

U.S. PATENT DOCUMENTS

| | | | | |
|---|---|---|---|---|
| 2,385,896 | A | * | 10/1945 | Von Beckerath ............ 310/365 |
| 2,510,811 | A | * | 6/1950 | Gale ..................... 310/312 |
| 3,766,616 | A | * | 10/1973 | Staudte ................... 29/25.35 |
| 4,468,582 | A | | 8/1984 | Fujiwara et al. |
| 4,562,370 | A | | 12/1985 | Von Dach |
| 4,614,925 | A | * | 9/1986 | Kane ..................... 333/174 |
| 4,642,505 | A | | 2/1987 | Arvanitis |
| 4,721,692 | A | | 1/1988 | Nishioka et al. |
| 4,820,897 | A | | 4/1989 | Lefevre |
| 4,900,892 | A | | 2/1990 | Baeuerle et al. |
| 5,045,746 | A | | 9/1991 | Wersing et al. |
| 5,345,361 | A | | 9/1994 | Billotte et al. |
| 5,493,541 | A | | 2/1996 | Snyder |
| 5,724,315 | A | * | 3/1998 | Moffett et al. ............ 367/153 |
| 5,872,419 | A | | 2/1999 | Hall et al. |

(Continued)

FOREIGN PATENT DOCUMENTS

JP     4-82312     *   3/1992   ............... 333/200

(Continued)

OTHER PUBLICATIONS

Database WPI Week 199405 Derwent Publications Ltd., London, GB; AN 1994-040551 XP002476467 & JP 05 347230 (Ohi Denki KK) Dec. 27, 1993 abstract.

(Continued)

*Primary Examiner*—Thomas M Dougherty
(74) *Attorney, Agent, or Firm*—Daniel J. Deneufbourg

(57) ABSTRACT

A piezoelectric element suitable for use as a sensor element in a hydrophone. In a preferred embodiment, the sensor element comprises a ceramic lead zirconate titanate substrate defining opposed ends and including at least first and second conductive strip electrodes on opposed top and bottom faces thereof. In accordance with the invention, at least one of the strip electrodes, and preferably at least the end of one of the strip electrodes disposed adjacent one of the opposed ends of the substrate, includes one or more spaced-apart laser cuts created during the manufacture of the sensor element for presetting the capacitance of the sensor element.

11 Claims, 1 Drawing Sheet

U.S. PATENT DOCUMENTS

| | | | |
|---|---|---|---|
| 6,326,563 B1 | 12/2001 | Takeuchi et al. | |
| 6,337,465 B1 | 1/2002 | Masters et al. | |
| 6,924,583 B2 * | 8/2005 | Lin et al. | 310/324 |
| 2002/0063496 A1 * | 5/2002 | Forck et al. | 310/332 |
| 2003/0011283 A1 | 1/2003 | Takeuchi et al. | |

FOREIGN PATENT DOCUMENTS

| | | | | |
|---|---|---|---|---|
| JP | 4-117179 A | * | 4/1992 | 310/365 |
| JP | 2005 328396 | | 11/2005 | |
| WO | WO-84/00082 | * | 1/1984 | |
| WO | WO 92/01520 | | 2/1992 | |

OTHER PUBLICATIONS

Meyer, Matthias, PCT International Search Report mailed: Apr. 29, 2008. re: International Application No. PCT/US2007/017102. filed Jul. 31, 2007.

Meyer, Matthias, PCT Written Opinion of the International Searching Authority mailed: Apr. 29, 2008. re: International Application No. PCT/US2007/017102. filed Jul. 31, 2007.

* cited by examiner

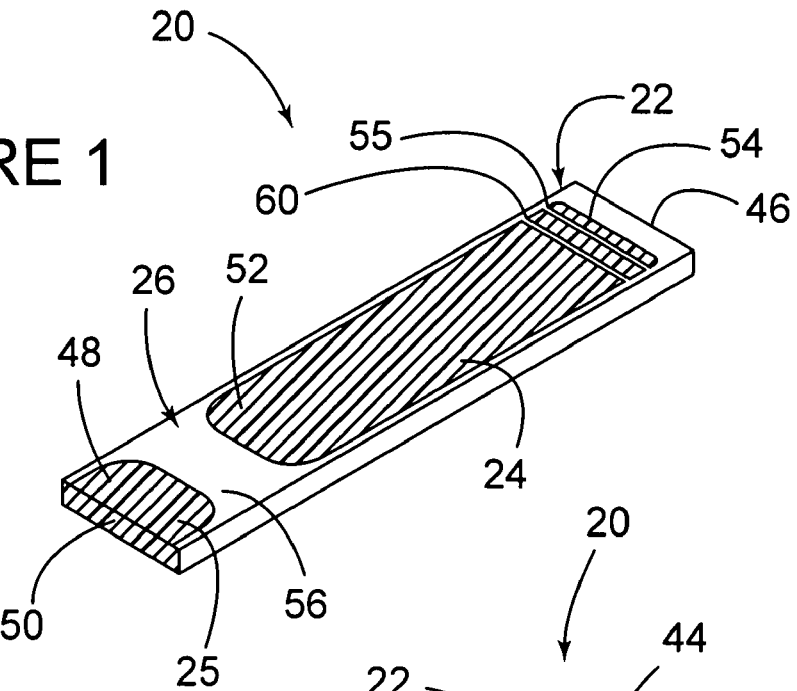
FIGURE 1
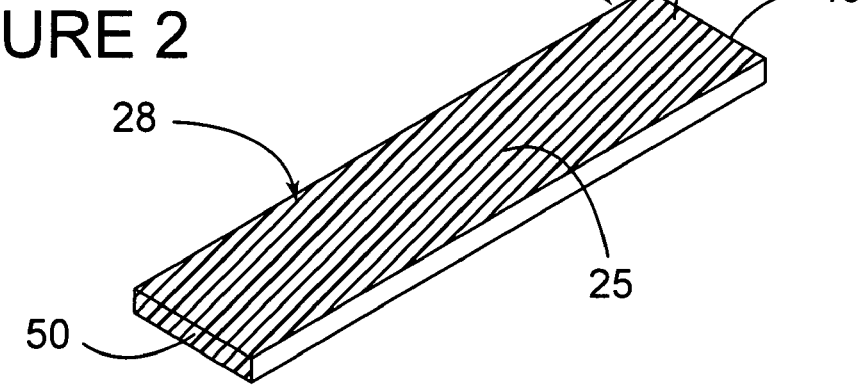
FIGURE 2
FIGURE 3

LASER CAPACITANCE TRIMMED PIEZOELECTRIC ELEMENT AND METHOD OF MAKING THE SAME

CROSS-REFERENCE TO RELATED APPLICATION

This non-provisional application claims the benefit of U.S. Provisional Application Ser. No. 60/834,879 filed on Aug. 2, 2006, the disclosure of which is explicitly incorporated herein by reference as are all references cited therein.

FIELD OF THE INVENTION

This invention relates generally to piezoelectric elements and, more specifically, to a precision laser capacitance trimmed PZT sensor element adapted for use in a hydrophone.

BACKGROUND OF THE INVENTION

Hydrophones are the basic acoustic sensing elements used in underwater acoustic measurement systems. They are usually of a piezoelectric type and can utilize sensor elements made of PZT (lead zirconate titanate) piezoceramic material. Typically, two PZT sensors are used in each section of the hydrophone. Each of the PZT sensors is comprised of a PZT sensor element which has been bonded to a separate conductive, flexible, ductile bender element such as a metal or the like.

For optimum hydrophone performance, the total capacitance of the two PZT sensor elements in each of the hydrophone sections must be equal in order to assure equal sensitivity in each of the hydrophone sections.

The present invention relates to a piezoelectric sensor and, more specifically, to a PZT piezoceramic sensor element with a capacitance value which is preset by laser capacitance trimming of the PZT sensor element substrate and/or the substrate/bender element combination to assure that all of the hydrophone sensor elements have equal and matching capacitance values.

SUMMARY OF THE INVENTION

The present invention relates generally to a piezoelectric element including a substrate defining respective top, bottom, and opposed first and second ends. At least a first layer of conductive material is formed on one the top and bottom faces of the substrate and defines at least a first electrode. At least a second layer of conductive material is formed on the other of the top and bottom faces of the substrate and defines at least a second electrode.

In a preferred embodiment, the sensor element is a piezoelectric sensor element comprised of a ceramic lead zirconate titanate material defining opposed first and second end faces. The first layer of material defines a first strip of metallized conductive material defining a first electrode with opposed ends where one of the ends wraps around the first end face of the substrate and terminates on the other of the top and bottom faces of the substrate. The second layer of material defines a second strip of metallized conductive material defining a second electrode with opposed ends where a first end is spaced from the wrap-around end of the first strip and an opposed second end is located adjacent the second end face of the substrate.

In the preferred embodiment, one or more laser cuts are formed in the second end of the second electrode adjacent the second substrate end face for the purpose of setting the desired capacitance value of the element. Preferably, a YAG laser is used to create the one or more cuts and the one or more laser cuts are oriented in a direction generally parallel to the substrate end faces and are spaced respective predetermined and calculated distances X and Y respectively away from the second substrate end face to create a sensor element with a desired pre-set capacitance value.

In accordance with the present invention, distance X is a predetermined distance while distance Y is a distance which is calculated and determined by measuring the nF/mm capacitance ratio of the element following the creation of the first cut.

Other advantages and features of the present invention will become more readily apparent from the following detailed description of the preferred hydrophone embodiment of the invention, the accompanying drawings, and the appended claims.

BRIEF DESCRIPTION OF THE DRAWINGS

In the FIGURES:

FIG. 1 is a perspective view of the top face of a PZT hydrophone sensor element in accordance with the present invention;

FIG. 2 is a perspective view of the bottom face of the PZT hydrophone sensor element in accordance with the present invention; and FIG. 3 is a top plan view of the top face of the PZT hydrophone sensor element of the present invention.

DETAILED DESCRIPTION OF THE PREFERRED EMBODIMENT

FIGS. 1-3 depict a PZT hydrophone sensor element, generally designated 20, which is comprised of a generally rectangularly shaped substrate 22 which, in the embodiment shown, is approximately 24.7 mm long×6.8 mm wide×0.5 mm high. Substrate 22 is preferably made of a ceramic PZT (lead zirconate titanate) piezoceramic material which has been appropriately pressed, heated, and bonded into a block.

The process or method for making a PZT sensor element 20 initially includes the step of placing the substrate 22 in a clamped metal fixture followed by the application, as by deposition or the like, of respective layers or strips 24 and 25 of metallized conductive material to the top and bottom faces 26 and 28 of the substrate 22 to define respective first and second strip electrodes on the opposed top and bottom faces 26 and 28 of substrate 22. The strips 24 and 25 in combination with the substrate 22 define a capacitor.

In a preferred embodiment, each of the layers or strips of metallized material 24 and 25 is composed of layers of flash tin and sputtered nickel.

Referring to the embodiment of FIG. 2, it is understood that the entire strip or layer of metallized material 25 extends the entire length of, and covers the entire surface of, the bottom substrate face 28. In the embodiment of FIG. 2, the strip 25 defines a first strip end or edge 44 which abuts against the edge of substrate end face 46 and an opposed second "wrap-around" end or edge 48 which extends around the opposed first substrate end face 50 and terminates on the substrate top face 26 (see FIGS. 1 and 3). The end or edge 48 of strip electrode 25 on substrate top face 26 is preferably spaced from the top and bottom edges of substrate top face 26.

Referring now to FIGS. 1 and 3, it is understood that, in this embodiment, the strip or layer of metallized material 24 extends along the length of the substrate top face 26 and defines a first strip end or edge 52 which is spaced from the "wrap-around" end or edge 48 of the strip of metallized material 25 and an opposed second end or edge 54 which is spaced from the edge of opposed second substrate end face 46. The top and bottom edges of the strip electrode 24 are also spaced from, and parallel to, the top and bottom edges of the top face 26 of substrate 22 so as to define a substrate where the top face 26 defines peripheral unmetallized edge regions surrounding at least the electrode 24.

Still referring to FIGS. 1 and 3, it is understood that the space or gap between the ends 48 and 52 of respective strips 25 and 24 defines an unmetallized region 56 on the top face 26 of substrate 22. In the embodiment shown, the gap 56 is located adjacent the first substrate end face 50. It is further understood that the end face 46 (not shown) as well as the other side faces defining the thickness of substrate 22 which separates the top and bottom substrate faces 26 and 28 likewise define unmetallized regions of the sensor element 20. Stated another way, end face 50 is the only "thickness" face which is metallized.

The capacitance of a piezoelectric element of the type disclosed herein is defined and determined by the equation $C=\epsilon A/d$, where $\epsilon$ is the dielectric constant of the piezoelectric substrate material; d is the gap between electrodes, i.e., the piezoelectric ceramic substrate thickness; and A is the effective area of the respective electrodes, i.e., the respective areas of the two strip electrodes which overlap each other in the perpendicular or Z direction.

As a result of factors inherent in the manufacture of piezoelectric elements including PZT sensor elements and the substrates thereof, there is a tendency for the PZT substrate dielectric constant to vary from sensor to sensor. Moreover, and as a result of the imprecise nature of the masking process which is used during the sputtering procedure, there is also a tendency for the effective area of the electrodes to vary from sensor to sensor. Still further, there is a tendency for the thickness of the PZT sensor substrate to vary from sensor to sensor. The combination of these and other factors has lead to the manufacture of sensors with unequal and varying capacitance values.

The nominal capacitance value of a raw PZT sensor element prior to laser trimming is about 7.9 nF. The present invention relates to a PZT hydrophone sensor element 20 which has been preset to a lower desired capacitance value using a laser capacitance trimming procedure in accordance with the present invention as described below in more detail.

In accordance with the present invention, a YAG or other suitable laser is used to create at least one cut or slice in the end or edge 54 of strip electrode 24. The end or edge 54 of strip electrode 24 is preferably trimmed or sliced in a direction parallel to the substrate end face 46 and preferably along an interior line, generally designated 55 in FIGS. 1 and 3, which is spaced from the end of strip electrode 24 to create and define a strip electrode 24 whose end or edge 54 has been electrically disconnected from the base portion thereof. FIGS. 1 and 3, for example, depict the first laser cut line 55 being created a predetermined distance X of about 0.5 mm from the end face 46 of substrate 22. Distance X is preferably constant from element to element.

Multiple cuts may be effected and/or needed even at the maximum preferred 15A DC laser current. Any required additional cuts are preferably also made in the end 54 of strip electrode 24 in a spaced apart relationship to define a strip electrode 24 including a plurality of electrically disconnected end or edge strips. In the embodiment shown, a second cut or slice 60 has been created a distance, generally designated Y, from the end face 46 of the substrate 22. Distance Y is preferably greater than distance X and is calculated and determined following the measurement of the capacitance of the element after the first laser cut 55 has been made. Stated another way, the capacitance of the element with only the first laser cut 60 determines the distance Y at which the second cut 60 is made to achieve the desired end capacitance value. Distance Y may thus vary from element to element.

The use of a YAG laser, instead of a $CO_2$ laser, is preferred to reduce the risk of creating microcracks in the ceramic material defining substrate 22. A typical ($\Delta$ capacitance) rate is 0.37 nF/mm.

The present invention contemplates the use of the following steps for trimming and presetting the capacitance of element 20. Initially, and following the manufacture of at least the substrate 22 and the application of electrode strips 24 and 25 thereon, the capacitance of element 20 is measured across the respective ends 48 and 52 of electrode strips 25 and 24 opposite the gap 56 on substrate top face 26 using any suitable measuring instrument.

A first laser slice, cut, or kerf of about 0.1 mm in thickness or width is made or created along the line 55 in the end or edge 54 of electrode strip 24 which is shown as being created in a direction generally parallel to the end face 46 of substrate 22 and a predetermined distance X of approximately 0.5 mm from the end substrate face 46. Following the first cut, the nF/mm ratio is recorded.

Depending on the value of this ratio, one or more additional spaced apart laser cuts or slices, generally designated by the line 60 in FIGS. 1 and 3, may be made and created in the end or edge 54 of electrode strip 24 in an orientation and direction parallel to substrate end face 46 and the first cut 55 and at a calculated incremental distance Y (FIG. 3) away from the edge 46 of substrate 22 until the capacitance reaches about 7.4 nF. The capacitance of sensor 20 can then be remeasured. The resulting sigma (standard deviation) can be as low as 0.03 nF. It is understood, of course, that the value of the nF/mm ratio of the element with only the slice 55 allows for the calculation of the distance and location Y of the slice or cut 60 from the face 46 of substrate 22.

In a typical hydrophone application, the capacitance trimmed PZT sensor element 20 can then be bonded to any suitable conductive, pliable bender element or layer such as, for example, a metal foil layer to form a so-called bender PZT sensor adapted to be inserted into a hydrophone.

What has thus been described is a PZT sensor element whose capacitance can be precisely preset through the use of a method which includes the step of capacitance trimming the sensor 20 by creating and forming one or more cuts in the end of one of the strip electrodes using a YAG laser as described above.

While the invention has been taught with specific reference to the embodiment and method described herein, it is understood that changes can be made in form and detail without departing from the spirit and the scope of the invention. The described embodiment is to be considered in all respects only as illustrative and not restrictive. The scope of the invention is, therefore, indicated by the appended claims rather than by the foregoing description. All changes that come within the meaning and range of equivalency of the claims are to be embraced within their scope.

For example, it is understood that the invention encompasses other embodiments where the laser cuts are formed in regions of the electrode 24 other than the end or edge 54 thereof such as, for example, the opposite end 52 thereof and/or selected regions of the other strip electrode 25 such as, for example, the wrap-around end or edge 48 thereof.

As another example, it is further understood that the invention also encompasses embodiments where the sensor element substrate is shaped other than a rectangle such as a round; where the sensor element substrate is a quartz element or a piezoceramic material other than PZT (lead zirconate titanate) material such as, for example, BaTiO$_3$ (barium titanate); the strip electrodes do not include any wrap-around portions; and/or the strip electrodes all formed on the substrate faces so as to define a plurality of capacitors as in the described embodiment.

As a further example, it is still further understood that the method described above for laser trimming the sensor element 20 can be effected following the bonding of the sensor element 20 to the separate metal foil layer or the like bender element.

What is claimed is:

1. A piezoelectric element comprising:
   a substrate defining a longitudinal axis and respective top and bottom faces, and opposed first and second ends extending in a relationship generally transverse to the longitudinal axis of the substrate;
   a first layer of conductive material on one of said top and bottom faces of said substrate extending on said substrate in the same direction as said longitudinal axis of said substrate and including a wrap-around end extending around said first end of said substrate and terminating on the other of said to and bottom faces;
   at least a second layer of conductive material on the other of said top and bottom faces of said substrate extending on said substrate in the same direction as said longitudinal axis of said substrate and including a first end spaced from said wrap-around end of said first layer of conductive material and a second end adjacent said second end of said substrate;
   the piezoelectric element being characterized in that said second layer of conductive material includes one or more laser cuts defined in one of the first and second ends of said second layer of conductive material for setting the capacitance of the piezoelectric element, said one or more laser cuts being oriented in a direction generally transverse to the longitudinal axis of the substrate.

2. The piezoelectric element of claim 1 adapted for use in a hydrophone wherein said substrate comprises a lead zirconate titanate material and said at least first and second layers of conductive material comprise layers of nickel and tin.

3. The piezoelectric element of claim 1 wherein said substrate is comprised of barium titanate.

4. The piezoelectric element of claim 1 wherein first and second laser cuts are defined in the second end of said second layer of conductive material, the second laser cut being spaced from said second end of said substrate a distance greater than the distance between said first laser cut and said second end of said substrate.

5. The piezoelectric element of claim 4 wherein said first and second laser cuts are defined and formed therein using a YAG laser.

6. A hydrophone sensor element comprising:
   a lead zirconate titanate substrate defining respective opposed top and bottom faces and opposed first and second ends;
   a first strip of metallized conductive material disposed on one of said top and bottom faces defining a first electrode including a wrap-around end extending around said first end of said substrate and terminating on the other of said top and bottom faces;
   a second strip of metallized conductive material disposed on the other of said top and bottom faces defining a second electrode, said second strip defining a first end which is spaced from said wrap-around end of said first electrode and a second end disposed adjacent said second end of said substrate;
   at least one laser cut defined in and extending through the material of said second end of said second electrode for setting the capacitance of the hydrophone sensor element.

7. The hydrophone sensor element of claim 6 wherein a first laser cut is defined in said second end of said second electrode a pre-determined distance X from said second end face of said substrate and a second laser cut is defined in said second end of said second electrode a calculated distance Y from said second end face of said substrate, said calculated distance Y being greater than said predetermined distance X and said first and second laser cuts being oriented in a relationship parallel to said second end face of said substrate.

8. A method of presetting the capacitance of a piezoelectric element comprising the steps of:
   a) providing a substrate defining respective top and bottom faces and opposed first and second ends, at least a first layer of metallized conductive material on said top face of said substrate defining a first electrode and at least a second layer of metallized conductive material on the bottom face of said substrate defining a second electrode, said second electrode defining opposed ends wherein one of the ends thereof defines a wrap-around end extending around said first end of said substrate and terminates on the top face of said substrate and said first electrode defines opposed first and second ends wherein said first end of said second electrode is spaced from said wrap-around end of said second electrode and said second end of said first electrode is located adjacent said second end of said substrate; and
   b) creating at least two cuts in the first or second end of the first electrode using a laser until the element exhibits a desired capacitance.

9. The method of claim 8 wherein said substrate defines a longitudinal axis and step b) includes the step of creating said at least two cuts in said first electrode which are oriented in a direction generally transverse to the longitudinal axis of said substrate.

10. The method of claim 8 further comprising the step of creating said first cut in said second end of said first electrode a predetermined distance X from the second end of said substrate and said second cut also in said second end of said first electrode a calculated distance Y from said second end of said substrate, the calculated distance Y being greater than the predetermined distance X and being calculated based upon the nF/mm capacitance ratio of the element following the creation of the first cut therein.

11. The method of claim 8 further comprising the step of bonding the piezoelectric element to a separate bender element prior to step b).

* * * * *